United States Patent [19]

Matsunaga et al.

[11] Patent Number: 5,742,171

[45] Date of Patent: Apr. 21, 1998

[54] TEST DEVICE FOR MULTI-CONTACT INTEGRATED CIRCUIT

[75] Inventors: Hitoshi Matsunaga; Kaori Tashiro, both of Tokyo, Japan

[73] Assignee: Unitechno, Inc., Tokyo, Japan

[21] Appl. No.: 705,210

[22] Filed: Aug. 29, 1996

[30] Foreign Application Priority Data

Sep. 19, 1995 [JP] Japan .................. 7-239527

[51] Int. Cl.$^6$ .................. G01R 31/02; H01R 9/09
[52] U.S. Cl. .................. 324/755; 324/762; 439/68
[58] Field of Search .................. 324/755, 761, 324/754, 760, 762; 439/64–74

[56] References Cited

U.S. PATENT DOCUMENTS

| | | | |
|---|---|---|---|
| 4,547,031 | 10/1985 | Korsumsky | 439/325 |
| 4,962,356 | 10/1990 | Eberlein et al. | 324/755 |
| 5,302,853 | 4/1994 | Volz et al. | 257/707 |
| 5,306,167 | 4/1994 | Nagumo | 439/226 |
| 5,410,258 | 4/1995 | Bowers et al. | 324/755 |
| 5,451,165 | 9/1995 | Cearley-Cabbiness et al. | 439/71 |

*Primary Examiner*—Ernest F. Karlsen
*Assistant Examiner*—Anh Phung
*Attorney, Agent, or Firm*—Ratner & Prestia

[57] ABSTRACT

Herein disclosed is a test device for testing an integrated circuit (IC) chip having a plurality of side edge portions each provided with a set of contact members. The test device comprises a socket base on which the IC chip is to be set, a plurality of contact units each including a contact support member and a set of socket contact members supported by the contact support member, and a contact retainer detachably mounted on the socket base to have the contact units retained with the socket contact members being held in contact with the contact members of the IC chip while the IC chip is set on the socket base. Each of the contact units can be removed from the socket base and replaced by a new contact unit if the socket contact members partly become fatigued and damaged, thereby making it possible to facilitate the maintenance of the test device.

14 Claims, 4 Drawing Sheets

TEST DEVICE FOR MULTI-CONTACT INTEGRATED CIRCUIT

BACKGROUND OF THE INVENTION

The present invention relates to a test device for testing a multi-contact integrated circuit (herein referred to simply as "IC") chip, and in particular to a test device suitable for the so-called "burn-in test" or "handler test" and including a socket base on which the multi-contact IC chip of a flat packaging or dual inline packaging type is to be set.

As is generally known, such an IC chip is apt to encounter a circuit failure at an initial or last stage of the average life time of the IC chip, while such the circuit failure rarely occurs during an intermediate stage between the initial and last stages of the average life time. The frequency of such the failure occurrence is varied along a curve indicative of a bathtub in response to a lapse of time after the IC chip is utilized. This leads to the fact that the circuit failure occurrence can be represented by a curve called "bathtub curve" which is utilized for many IC chip tests such as a burn-in test and other shipping tests for ICs.

The burn-in test is performed by an exclusive test circuit called "burn-in board" under the state that dozens of test sockets are mounted on the burn-in board. One of the typical prior art test sockets is shown in FIG. 3 as being a prior art test socket 2 and comprising a socket base 2a, a square central cavity 3, and four contact rows 4 each including a plurality of socket contact members 5. FIG. 3 also shows an IC chip 1 of quadrilateral and flat packaging type that has plural sets of lead portions 1a. The IC chip 1 is inserted in the central cavity 3 of the test socket 2 and set at a predetermined position to have the lead portions 1a of the IC chip 1 electrically connected to the burn-in board through the socket contact members 5. The IC chip 1 in the central cavity 3 is depressed by depressing means not shown in the drawings at an adequate pressure, and tested by performing a screening operation at an atmospheric temperature more than 100° C. to screen in a short time every IC chip that is likely to develop trouble or to break down. The lead portions 1a of the IC chip 1 are arranged on four sides, while the socket contact members 5 of the test socket 2 are also arranged on four sides to form four contact rows although two contact rows are hidden by the socket base 2a of the test socket 2.

In FIG. 4, the socket contact members 5 are arranged in a row at a constant pitch to form one of the contact rows 4. Each of the socket contact members 5 consists of a contact end portion 5a, an elastic arm portion 5b, a base portion 5c and an insert pin portion 5d. The contact end portions 5a of the socket contact members 5 are respectively supported by the base portions 5c through the elastic arm portions 5b to be displaced by depressing force from the lead portions 1a of the IC chip 1, while the insert pin portions 5d of the socket contact members 5 are fitted into a plurality of through holes 3a formed in the test socket 2 in order to have the base portions 5c of the socket contact members 5 mounted on the socket base 2a of the test socket 2. The pin portions 5d of the socket contact members 5 protruding from the bottom surface of the test socket 2 is inseparably soldered with the burn-in board. This means that the test socket 2 is inseparably mounted on the burn-in board through the soldered pin portions 5d of the socket contact members 5.

The above prior-art test device, however, encounters a drawback that the elastic arm portions 5b of the socket contact members 5 are apt to be fatigued and damaged. The damaged test sockets 2 are required to be replaced by new test sockets in spite of the fact that the dozens of test sockets 2 are not easily removable from the burn-in board. The burn-in board with the dozens of test sockets is therefore destined to be replaced by a new burn-in board in an early stage.

SUMMARY OF THE INVENTION

It is therefore an object of the present invention to provide a test device partly replaceable and capable of lasting long.

According to one aspect of the present invention there is provided a test device for testing a multi-contact integrated circuit (IC) chip having a plurality of side edge portions each provided with a set of contact members. The test device comprises a socket base on which the IC chip is to be set, a plurality of contact units each including a contact support member and a set of socket contact members supported by the contact support member, and a contact retainer detachably mounted on the socket base to have the contact units retained with the socket contact members being held in contact with the contact members of the IC chip while the IC chip is set on the socket base.

According another aspect of the present invention there is provided a test device for testing a multi-contact IC chip having a plurality of side edge portions each provided with a set of contact members. The test device comprises a test circuit board operable to perform a testing operation for testing the IC chip, a socket base on which the IC chip is to be set, the socket base being mounted on the test circuit board, a plurality of contact units each including a contact support member and a set of socket contact members supported by the contact support member, and a contact retainer detachably mounted on one of the test circuit board and the socket base to have the contact units retained with the socket contact members being held in contact with the contact members of the IC chip while the IC chip is set on the socket base.

The socket base may have a plurality of through holes respectively having the contact units received therein and the socket contact members pass therethrough to contact with the test circuit board. The socket base may also be formed with a central cavity having the IC chip received therein.

The socket base may have a plurality of through holes respectively having the contact units received therein and the socket contact members pass therethrough to contact with the test circuit board.

The socket contact members of each of the contact units may have respective projection portions projecting from the socket base to be contactable with the contact members of the multi-contact IC chip on the socket base.

The contact retainer may be fitted with the socket base when the IC chip is received in the central cavity of the socket base which has a generally square contour the same as that of the contact retainer.

BRIEF DESCRIPTION OF THE DRAWINGS

The features and advantages of a test device for a multi-contact IC chip according to the present invention will be more clearly understood from the following description taken in conjunction with the accompanying drawings in which.

DESCRIPTION OF THE PREFERRED EMBODIMENTS

Figure 1:
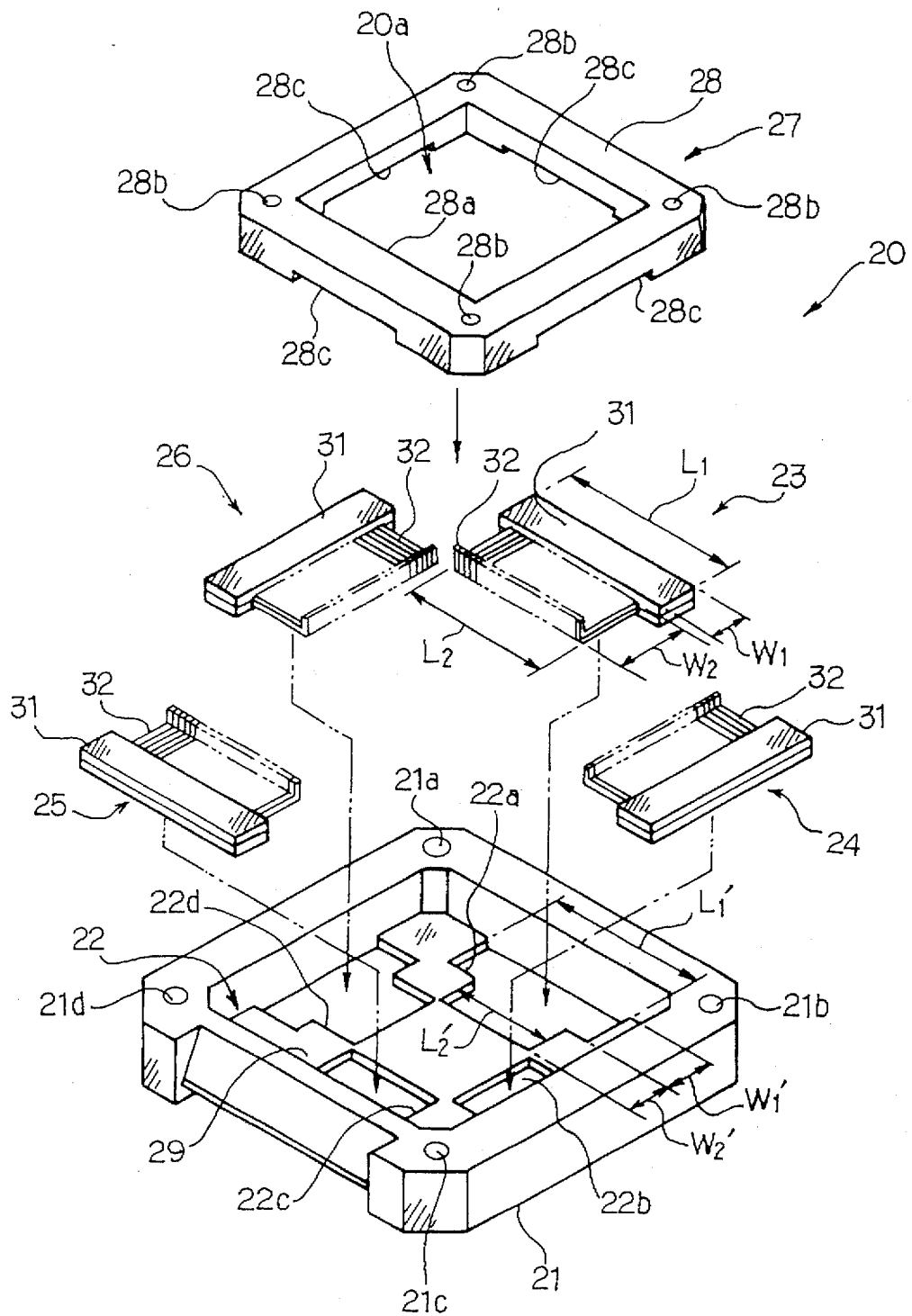
FIG. 1 is an exploded perspective view of a first embodiment of the test device according to the present invention.
Figure 2:
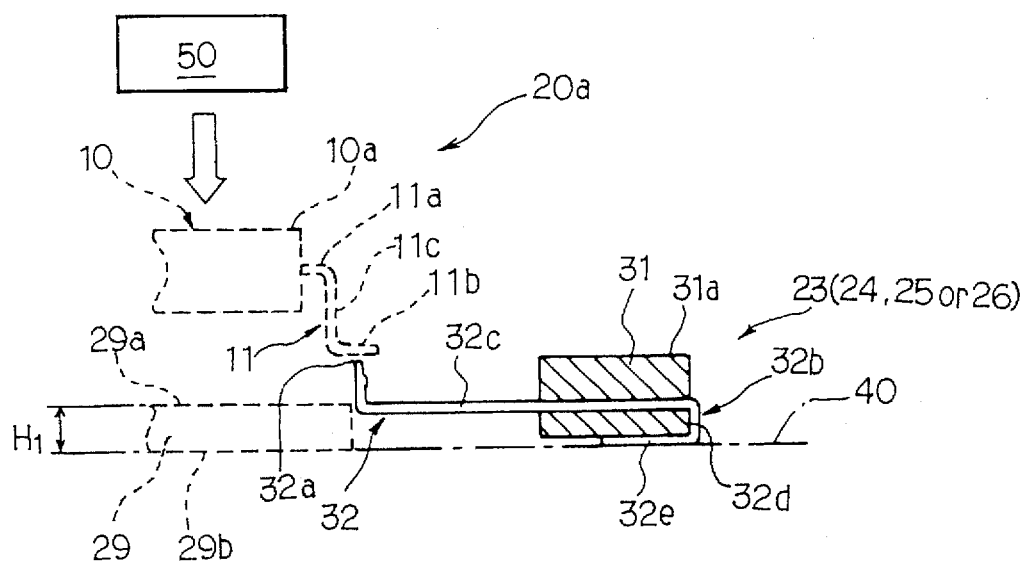
FIG. 2 is an enlarged fragmentary cross-sectional view showing a contact unit forming part of the test device.
Figure 3:
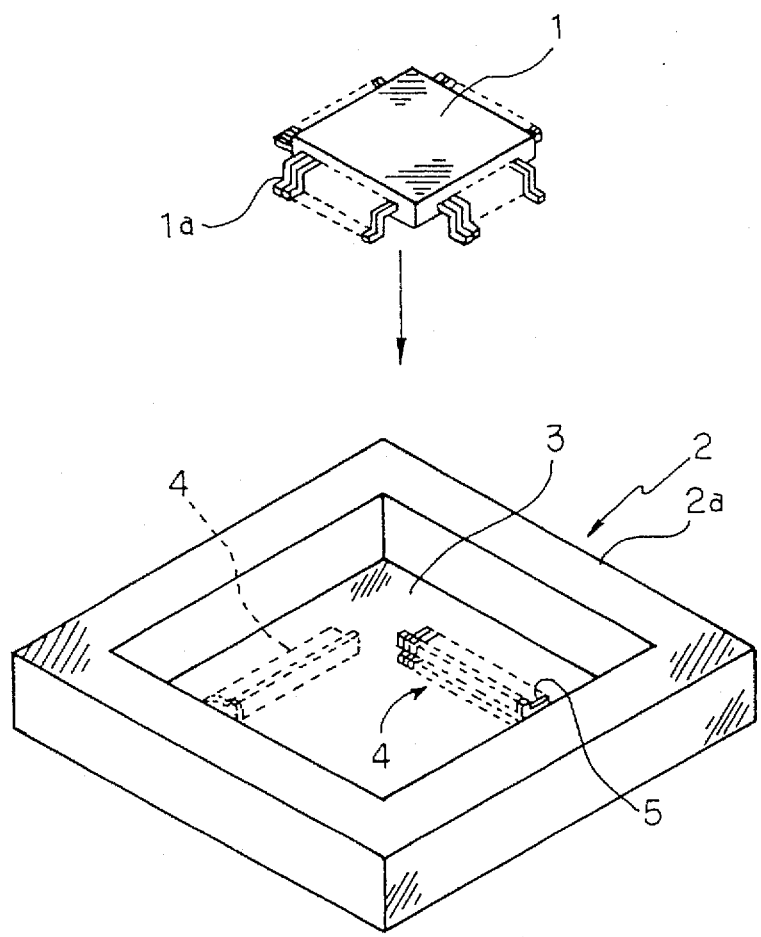
FIG. 3 is an exploded perspective view of a prior-art test device for a multi-contact IC chip.
Figure 4:
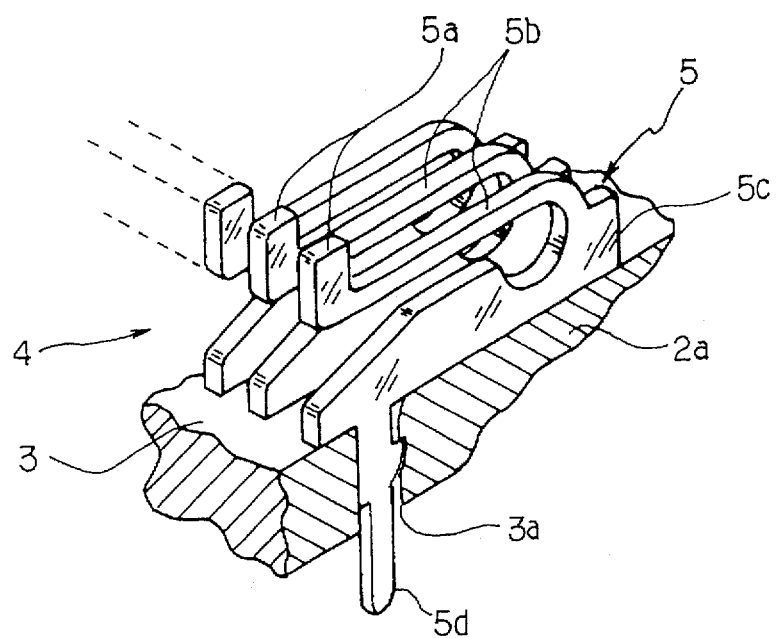
FIG. 4 is an enlarged fragmentary perspective view of a plurality of socket contact members forming part of the prior art test device shown in FIG. 3.

Referring to FIGS. 1 and 2 of the drawings, a preferred embodiment of a test device for testing a multi-contact integrated circuit (IC) chip, embodying the present invention, is shown as comprising a socket base 21 having a central cavity 22, a plurality of contact units 23, 24, 25 and 26 each removably mounted on the socket base 21, and retaining means 27 including a generally square contact retainer 28 and four retainer screws not shown in the drawings for retaining the contact units 23 through 26. The socket base 21 is formed with four through holes 21a, 21b, 21c and 21d into which four socket mounting screws not shown in the drawings are respectively inserted to removably mount the socket base 21 on a print-circuit board 40 shown in FIG. 2. The print-circuit board 40 is a test circuit, e.g. a burn-in board, operable to perform a testing operation for testing multi-contact IC chips. Each of the socket mounting screws may be replaced by another means for depressing or clamping the socket base 21 on the burn-in board 40, while each of the retainer screws may be replaced by another means for separably clamping the contact retainer 28 with the socket base 21.

The multi-contact IC chip is shown in FIG. 2 as being a quadrilateral and flat packaging type IC chip 10 which has four side edge portions 10a each provided with a set of contact members such as for example a set of lead pins 11. It is to be understood, however, that the multi-contact IC chip 10 may have another type of contact members, e.g., contact pads. Each of the lead pins 11 is crooked to have an upper portion 11a, a lower contact portion 11b extending in parallel with the upper portion 11a, and a standing portion 11c perpendicularly extending and connected at one end with the upper portion 11a and the other end with the lower contact portion 11b.

The reference numeral 50 designates depressing means for depressing the multi-contact IC chips 10 under a depressing force. The depressing force is set at a certain force level sufficient to have the lead pins 11 of the IC chips 10 brought into contact with the socket contact members 32 of the contact units 23 through 26 and to make an electrical connection between each lead pin portion 11 of the IC chips 10 and each socket contact member 32 of the contact units 23 through 26.

As shown in FIGS. 1 and 2, the contact units 23 through 26 are identical to one another in shape, and two of the contact units 23 and 25 have a pair of contact support members 31 arranged in parallel with each other and each extending in a first direction, while the other two of the contact units 24 and 26 have a pair of contact support members 31 arranged in parallel with each other and each extending in a second direction perpendicular to the first direction. Each of the contact units 23 through 26 further includes a set of socket contact members 32 each made of metal and supported by the contact support member 31. The contact units 23 through 26 thus number four, but may number two in the case that the integrated circuit chip is constituted by an IC chip having two side edge portions, such as for example a dual inline packaging type IC chip. In this case, the central cavity 22 of the socket base 21 and the contact retainer 28 may be rectangular in shape.

Each of the contact support members 31 has a rectangular flat surface 31a having a length L1 and a width W1. The socket contact members 32 are arranged in a row at a predetermined pitch to form a contact region having a length L2 and a width W2, while the contact support member 31 are each molded out of a dielectric material or an insulation material to have the socket contact members 32 partly inserted therein. The contact support member 31 of each of the contact units 23 through 26 is thus elongated in a direction to support the socket contact members 32 in a row.

The socket contact members 32 of the contact units 23 through 26 have respective inner projection portions 32a and outer portions 32b. The inner projection portions 32a of the socket contact members 32 are crooked to have their respective bending arm portion 32c project inwardly to be able to contact with the flat contact portions 11b of the multi-contact IC chip 10, while the outer portions 32b of the socket contact members 32 are insulated from one another by the contact support member 31 and outwardly crooked to have their respective standing portions 32d and flat contact portions 32e. The flat contact portions 32e of the socket contact members 32 face to the burn in board 40 and are held in contact with predetermined test contact portions of the burn in board 40. The socket contact members 32 of each contact unit 23, 24, 25 or 26 numbers "n" equal to the number of the lead pins 11 arranged in each of the side edge portions 10a of the multi-contact IC chip 10.

The inner projection portions 32a of the socket contact members 32 are positioned to project inwardly from the inner bottom surface 29a of the socket base 21 in perpendicular relationship with the inner bottom surface 29a of the socket base 21, but may be flush with or retracted outwardly from the inner bottom surface 29a of the socket base 21.

The inner frame 28 has a square center hole 28a, four through holes 28b and four concave portions 28c held in contact with the contact support members 31 of the contact units 23 through 26. The contact retainer 28 has a generally square contour approximately the same as or slightly smaller than that of the central cavity 22. The concave portions 28c of the contact retainer 28 are held in contact with the contact units 23 through 26 while the IC chip 10 is in the central cavity 22 of the socket base 21. The corners of the contact retainer 28 are each chamfered, and the central cavity 22 of the socket base 21 slightly larger than that of the contact retainer 28 is similarly chamfered at its four corners to be generally square. This allows the contact retainer 28 to be received in the central cavity 22 of the socket base 21.

The above socket base 21, the contact units 23 through 26 and the contact retainer 28 collectively form a test socket 20 having a square chip set space 20a in which the multi-contact IC chip 10 is to be set to have the lead pins 11 brought into contact with the socket contact members 32 of the contact units 23 through 26. The lead pins 11 are respectively held in contact with the socket contact members 32 of the contact units 23 through 26 while the multi-contact IC chip 10 is being set in the test socket 20.

On the other hand, the socket base 21 has a bottom portion 29 and is formed with an inner and outer bottom surfaces 29a and 29b on both sides of the bottom portion 29. The socket base 21 also has a plurality of bottom through holes 22a, 22b, 22c and 22d each integrated with the central cavity 22 and respectively having the contact units 23 through 26 received therein and the socket contact members 32 pass therethrough to the contact with contact portions of the test circuit board 40. Each of the bottom through holes 22a through 22d consists of a rectangular first portion and a rectangular second portion smaller than the first portion in area. The first portion of each bottom through hole 22a, 22b, 22c or 22d has a length L1' and a width W1', while the second portion of each bottom through hole has a length L2' and a width W2'. The lengths L1', L2' and widths W1', W2' of the through holes 22a through 22d are approximately the same as or slightly larger than those of the contact units 23 through 26, respectively. The depth of each bottom through hole 22a, 22b, 22c or 22d, i.e., the height from the outer bottom surface 29b of the socket base 21 to the inner bottom surface 29a of the socket base 21, is substantially equal to the height from the bottom surface of each contact unit 23, 24, 25 or 26 to the upper surface of the bending arm portion 32c of each socket contact member 32. The depth of each bottom through hole 22a through 22d, i.e., the thickness of the bottom portion 29 of the socket base 21, is shown in FIG. 2 as being equal to the height H1 from the upper surface of the test circuit board 40 to the upper surface of the bending arm portion 32c of each socket contact member 32. The thickness of the bottom portion 29 is substantially equal to the depth of the concave portion 28c of the contact retainer 28, while the thickness of the contact support member 31 corresponds with the total of the thickness of the bottom portion 29 and the depth of the concave portion 28c of the contact retainer 28. The length of each concave portion 28c of the contact retainer 28 is exactly the same as length L1' of each bottom through hole 22a, 22b, 22c or 22d.

The operation of the above test device will be described hereinlater.

At first, the socket base 21 is mounted on the test board 40 by the socket mounting screws. The contact units 23 through 26 are then respectively received in the bottom through holes 22a through 22d, and the contact retainer 28 is received in the central cavity 22 of the socket base 21. Other test sockets are also detachably mounted on the burn-in board in the same manner as above.

The multi-contact IC chip 10 is then set on the socket base 21, and is depressed by the depressing means 50 to have the lead pin portion 11 of the multi-contact IC 10 held in contact with the socket contact members 32 of the contact units 23 through 26 at an adequate pressure. Similarly, other IC chips are set on other socket bases mounted on the burn-in board 40, and the IC chips are depressed by other depressing means.

The multi-contact IC chip 10 and the test socket 20 are then supplied with electricity from the burn-in board 40 and operated in accordance with a predetermined screening program at an atmospheric temperature more than 100° C. The multi-contact IC chip 10 and other IC chips are thus tested by performing the screening operation at a high temperature to screen in a short time every IC chip that is likely to develop trouble or to break down.

When the screening operation is finished, the multi-contact IC chip 10 is released from the depressing means 50 and replaced by a new multi-contact IC chip to be tested, and other IC chips on the burn-in board 40 are also replaced by other new IC chips.

At this time, the inner projection portions 32a of the socket contact members 32 are released from the depression means 50 and depressed again after the new IC chip is set in the test socket 20. This means that the socket contact members 32 are repeatedly depressed and released and therefore apt to become fatigued.

If one of the socket contact members 32 of the test socket 20 becomes fatigued and is finally damaged, the contact retainer 28 is removed from the socket base 21 by unscrewing the above retainer screws. Then, one of the contact units 23 through 26 including the fatigued and damaged socket contact member 32 is replaced by a new contact unit. The contact retainer 28 is then detachably mounted on the socket base 21 again by screwing the above retainer screws.

As aforementioned, the test socket 20 can be repaired by replacing only part of the contact units 23 through 26 without removing the socket base 21 from the burn-in board 40. This makes it not only possible to easily maintain the test sockets on the burn-in board 40 even if the socket bodies are soldered with the contact portions of the burn-in board 40, but also possible to reduce the maintenance cost of the test device including the test sockets and the burn-in board.

In addition, the test socket 20 can be modified to have a new contact unit having a plurality of socket contact members different from those of the contact units 23 through 26 or to change the number of the socket contact members 32 and the pitch between adjacent two socket contact members 32. This results in the fact that the test socket 20 can be used for testing various IC chips different from one another in size, lead pitch or the like.

The present invention has thus been shown and described with reference to specific embodiments, however, it should be noted that the present invention is not limited to the details of the illustrated structures but changes and modifications may be made without departing from the scope of the appended claims.

What is claimed is:

1. A test device for testing a multi-contact integrated circuit chip package having a plurality of side edge portions each having a set of contact leads, the test device comprising:
    a socket base on which said integrated circuit chip package is to be set;
    a plurality of replaceable contact modules each including contact members for contacting said contact leads of said integrated circuit chip package and support member means for holding said contact members; and
    a contact module retainer means detachably mounted on said socket base for retaining said contact modules in said socket base with said contact members positioned to contact said contact leads of said integrated circuit chip package when said integrated circuit chip package is inserted in said socket base.

2. A test device as set forth in claim 1, in which said socket base has a plurality of through holes respectively having said contact modules received therein and said contact members pass therethrough.

3. A test device as set forth in claim 2, in which said contact members of each of said contact modules have respective projection portions projecting from the bottom portion of said socket base to be contactable with said contact leads of said integrated circuit chip package on said socket base.

4. A test device as set forth in claim 1, in which said socket base is formed with a central cavity having said integrated circuit chip package received therein.

5. A test device as set forth in claim 4, in which said contact module retainer means is fitted with said socket base when said integrated circuit chip package is received in said central cavity of said socket base.

6. A test device as set forth in claim 5, in which said central cavity of said socket base has a generally square contour the same as that of said contact module retainer means.

7. A test device for testing a multi-contact integrated circuit chip package having a plurality of side edge portions each having a set of contact leads, the test device comprising:

a test circuit board operable to perform a testing operation for testing said integrated circuit chip package;

a socket base on which said integrated circuit chip package is to be set, said socket base being mounted on said test circuit board;

a plurality of replaceable contact modules each including contact members for contacting said leads of said integrated circuit chip package and support member means for holding said contact members; and a contact module retainer means detachably mounted on one of said test circuit board and said socket base for retaining said contact modules in said socket base with said contact members positioned to contact said contact leads of said integrated circuit chip package when said integrated circuit chip package is inserted in said socket base.

8. A test device as set forth in claim 7, in which said socket base has a plurality of through holes respectively having said contact modules received therein and said contact members pass therethrough to contact with said test circuit board.

9. A test device as set forth in claim 8, in which said contact members of each of said contact modules have respective projection portions projecting from the bottom portion of said socket base to be contactable with said contact leads of said integrated circuit chip package on said socket base.

10. A test device as set forth in claim 7, in which said socket base is formed with a central cavity having said integrated circuit chip package received therein.

11. A test device as set forth in claim 10, in which said contact module retainer means is fitted with said socket base when said integrated circuit chip package is received in said central cavity of said socket base.

12. A test device as set forth in claim 11, in which said central cavity of said socket base has a generally square contour the same as that of said contact module retainer means.

13. A test device for testing a multi-contact integrated circuit chip having a plurality of side edge portions each having a set of external contact leads, the test device comprising:

a) a socket base including a cavity having an interior, a top, a bottom, and a plurality of side walls;

b) a plurality of replaceable contact modules each comprising a dielectric support having a side, a top and a bottom, and a predetermined number of test electrodes mounted thereon, each electrode having a flexible first portion extending from said support in a first direction and providing a first electrical contact point and a second portion extending in a second direction and providing a second electrical point, all first portions extending from a same side of said dielectric support and all second portions extending of said electrodes extending from a same side of said support;

c) receiving means in said socket base for receiving said contact modules with said flexible first electrode portions extending to the interior of said cavity and flexing in the direction of the cavity bottom; and d) a single contact module retainer means having a top, a bottom, a plurality of retainer side walls and a central cavity surrounded by said retainer side walls, the module retainer means detachable mounted on said socket base for retaining said contact modules in said socket base.

14. The test device as set forth in claim 13, in which the replaceable contact module dielectric support further comprises a top block and a bottom block, the electrodes are held between said top and said bottom blocks, and wherein the second portion of the electrodes extends from said dielectric support and wraps around a portion of said bottom block.

* * * * *